(12) United States Patent
Kim

(10) Patent No.: US 6,627,382 B2
(45) Date of Patent: Sep. 30, 2003

(54) FLUORO-CONTAINING PHOTOSENSITIVE POLYMER AND PHOTORESIST COMPOSITION CONTAINING THE SAME

(75) Inventor: Hyun-woo Kim, Suwon (KR)

(73) Assignee: Samsung Electronics, Co., Ltd., Kyungki Do (KR)

( * ) Notice: Subject to any disclaimer, the term of this patent is extended or adjusted under 35 U.S.C. 154(b) by 0 days.

(21) Appl. No.: 09/947,582

(22) Filed: Sep. 6, 2001

(65) Prior Publication Data

US 2002/0177067 A1 Nov. 28, 2002

(30) Foreign Application Priority Data

May 2, 2001 (KR) ........................ 2001-23752

(51) Int. Cl.[7] .................. G03F 7/004; C08F 214/18
(52) U.S. Cl. .................. 430/270.1; 430/907; 526/242; 526/247; 526/270; 526/281
(58) Field of Search .............. 430/270.1, 907; 526/242, 247, 281, 270

(56) References Cited

U.S. PATENT DOCUMENTS

| | | | | |
|---|---|---|---|---|
| 4,530,569 A | * | 7/1985 | Squire | 350/96.34 |
| 4,935,477 A | * | 6/1990 | Squire | 526/247 |
| 4,966,435 A | * | 10/1990 | Matsumoto et al. | 350/96.34 |
| 5,759,625 A | * | 6/1998 | Laubacher et al. | 427/264 |

* cited by examiner

Primary Examiner—Rosemary Ashton
(74) Attorney, Agent, or Firm—F. Chau & Associates, LLP.

(57) ABSTRACT

A photosensitive polymer is provided which includes: (a) perfluoro-2,2-dimethy-1,3-dioxol derivatives having the following repeating unit:

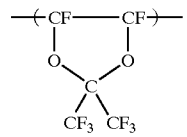

and (b) vinyl derivatives having the following repeating unit:

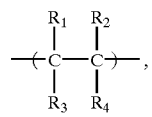

wherein $R_1$ is H, Cl, or F; each of $R_2$ and $R_3$ is H or F; $R_4$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon. A photoresist composition includes the photosensitive polymer and a photoacid generator(PAG).

46 Claims, No Drawings

FLUORO-CONTAINING PHOTOSENSITIVE POLYMER AND PHOTORESIST COMPOSITION CONTAINING THE SAME

BACKGROUND OF THE INVENTION

1. Field of the Invention

The present invention relates to a photoresist composition, and more particularly, to a photoresist composition comprising fluoro-containing polymer.

2. Description of the Related Art

As the manufacture of semiconductor devices becomes more complex and semiconductor chips are more integrated, it is essential to form fine patterns in photolithography. Furthermore, as the capacity of a semiconductor memory device increases to exceed 4 Gigabit, a pattern size having a design rule less than 0.1 μm is required. Accordingly, there are limitations to using a KrF excimer laser (248 nm wavelength) or an ArF excimer laser (193 nm wavelength) as the light source in photolithography. Thus, a new laser referred to as a "$F_2$ excimer laser (157 nm wavelength)" has been introduced.

In general, a photosensitive polymer is used as photoresist material for the $F_2$ excimer laser. The photoresist material should have characteristics of: (1) being transparent against 157 nm wavelength, (2) having high resistance to dry etching, (3) having excellent adhesion to a underlying layer and (4) being capable of being easily developed using a developer such as tetramethyl ammonium hydroxide (TMAH), which is very common in semiconductor manufacturing.

However, conventional photosensitive polymers have poor optical transparency at 157 nm wavelength. When the conventional photosensitive polymer is used for the photoresist material layer, the photoresist material is formed on an underlying layer with thickness of about 1,000 Å, which is a much thinner thickness than normal thickness of the photoresist material. In this case, the photoresist material layer displays inadequate etch resistance and in some cases, can be defective because of a thinner thickness layer.

Thus, much research has been devoted to a photosensitive polymer suitable for use with a $F_2$ excimer laser (157 nm wavelength), in which a fluorine is introduced to a photosensitive polymer. This polymer may be represented by the following chemical formula:

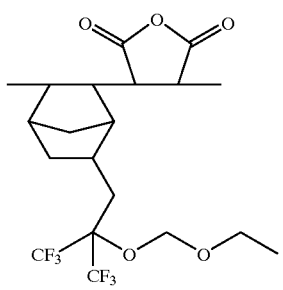

[Chemical formula 1]

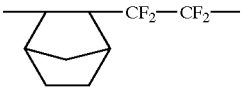

[Chemical formula 2]

The photosensitive polymer having maleic anhydride such as Chemical formula 1, may be easily made into a radical polymerization, and can improve on the adhesion characteristics with respect to an underlying layer. However, the photoresist material having maleic anhydride has poor optical transparency. The photoresist material having Chemical formula 2 has better optical transparency than the photoresist material having Chemical 1, but it has poor adhesion to an underlying layer because of hydrophobic characteristic.

Accordingly, it would be desirable to develop new photoresist materials, which have: (1) high optical transparent at a wavelength of 157 nm; (2) strong resistance to dry etching; and (3) excellent adhesiveness to a underlying layer.

SUMMARY OF THE INVENTION

A photosensitive polymer is provided which comprises: (a) perfluoro-2,2-dimethy-1,3-dioxol derivatives having the following repeating unit:

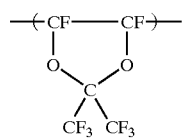

and (b) vinyl derivatives having the following repeating unit:

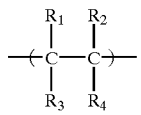

wherein $R_1$ is H, Cl, or F; each of $R_2$ and $R_3$ is H or F; $R_4$ is H, F, $CF_3$, $OCF_3$, $OCF_2CF_3$, $OCF_2CF_2CF_3$, $CH_2C(CF_3)_2$OH, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

According to the preferred embodiment of the present invention, $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$, the photosensitive polymer has a weight average molecular weight ranging from about 3,000 to about 200,000. Preferably, the photosensitive polymer has a weight average molecular weight ranging from about 4,000 to about 50,000.

A photosensitive polymer is provided which comprises: (a) perfluoro-2,2-dimethy-1,3-dioxol derivative having the following repeating unit:

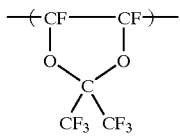

and (b) norbornen derivative having the following repeating unit:

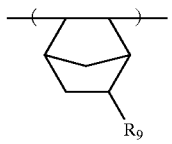

wherein $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

According to a preferred embodiment of the present invention, $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$. The photosensitive polymer has a weight average molecular weight ranging from about 3,000 to about 200,000. Preferably, the photosensitive polymer has a weight average molecular weight ranging from about 4,000 to about 50,000.

A photosensitive polymer is provided which comprises: (a) perfluoro-2,2-dimethy-1,3-dioxol derivative having the following repeating unit:

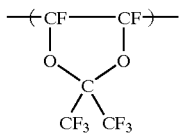

(b) vinyl derivative having the following repeating unit:

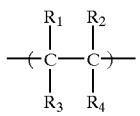

and (c) norbornen derivative having the following repeating unit:

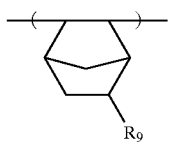

wherein $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q includes perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

According to a preferred embodiment of the present invention, at least one of $R_4$ and $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$. The photosensitive polymer has a weight average molecular weight ranging from about 3,000 to about 200,000. Preferably, the photosensitive polymer has a weight average molecular weight ranging from about 4,000 to about 50,000.

A photoresist compostion is also provided which comprises: (a) a photosensitive polymer comprsing: (a-1) perfluoro-2,2-dimethy-1,3-dioxol derivatives having the following repeating unit:

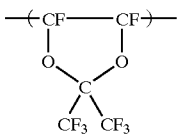

and (a-2) at least one comonomer of a vinyl derivative having the following repeating unit:

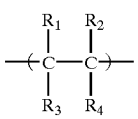

and a norbornen derivative having the following repeating unit:

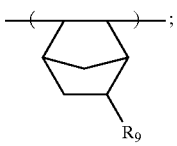

and (b) a photoacid generator (PAG),
wherein $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

According to the preferred embodiment of the present invention, at least one of $R_4$ and $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

According to an aspect of the invention, the photoresist composition includes from about 0.5 to about 20 weight percent of the photoacid generator based on the weight of the photosensitive polymer, and the photoacid generator is selected from the group consisting of triarylsulfonium salt, diaryliodonium salt, sulfonate, and the mixtures thereof.

According to an aspect of the invention, the photoresist composition further includes an organic bases in an amount of from about 10 to about 50 mole percent based on the mole of the photoacid generators. Preferably, the organic base is selected from the tertiary amine group and mixtures thereof.

DETAILED DESCRIPTION OF THE INVENTION

The present invention now will be described more fully hereinafter with reference to the accompanying specification, in which preferred embodiments of the invention are shown. This invention may, however, be embodied in many different forms and should not be construed as limited to the embodiments set forth herein; rather, these embodiments are provided so that this disclose will be thorough and complete, and will fully convey the scope of the invention to those skilled in the art.

The present invention relates to first photosensitive polymers comprising:

(a) perfluoro-2,2-dimethy-1,3-dioxol derivatives having the following repeating unit:

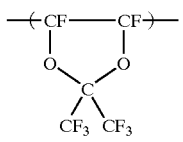

and (b) vinyl derivatives having the following repeating unit:

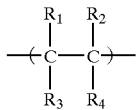

In the above formula, $R_1$ is H, Cl, or F; each of $R_2$ and $R_3$ is H or F; $R_4$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

The photosensitive polymers may have various molecular weights. Preferably, the photosensitive polymers have weight average molecular weights ranging from about 3,000 to about 200,000. More preferably, the weight average molecular weights range from about 4,000 to about 50,000.

According to the present invention, the first photosensitive polymer is expressed by the following chemical formula:

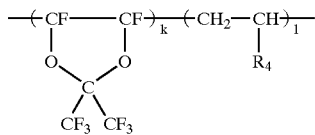

In the above formula, $R_4$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, $R_4$ is fluorinated alkyloxy group having an acid-labile group. More preferably, $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$. The ratio of $k/(k+l)$ ranges from about 0.2 to about 0.7.

According to the present invention, the first photosensitive polymer also is expressed by the following chemical formula:

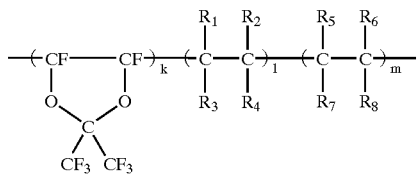

In the above formula, each of $R_9$ and $R_5$ is H, Cl, or F; each of $R_2$, $R_3$, $R_6$ and $R_7$ is H or F; each of $R_4$ and $R_8$ is H, F, $CF_3$, $OCF_3$, $OCF_2CF_3$, $OCF_2CF_2CF_3$, $CH_2C(CF_3)_2$ OH, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon). At least one of $R_4$ and $R_8$ includes fluorinated alklyoxy group having an acid-labile group. The ratio of $k/(k+l+m)$ ranges from about 0.1 to about 0.7; the ratio of $l/(k+l+m)$ ranges from about 0.1 to about 0.6; and the ratio of $m/(k+l+m)$ ranges from about 0.1 to about 0.6.

Preferably, at least one of $R_4$ and $R_8$ is fluorinated alkyloxy group having an acid-labile group. More preferably, at least one of $R_4$ and $R_8$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

The present invention also relates to second photosensitive polymers comprising:

(a) perfluoro-2,2-dimethy-1,3-dioxol derivatives having the following repeating unit:

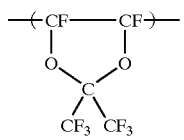

and (b) norbornen derivatives having the following repeating unit:

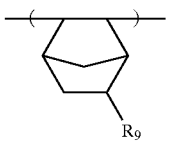

In the above formula, $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, $R_9$ is fluorinated alkyloxy group having an acid-labile group. More preferably, $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

The photosensitive polymers may have various molecular weights. Preferably, the photosensitive polymers have weight average molecular weights ranging from about 3,000 to about 200,000. More preferably, the weight average molecular weights range from about 4,000 to about 50,000.

According to a present invention, the second photosensitive polymer is expressed by the following chemical formula:

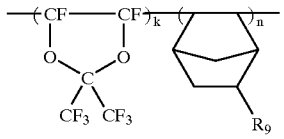

In the above formula, $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon). The ratio of k/(k+n) ranges about from about 0.2 to about 0.7.

Preferably, $R_9$ is fluorinated alkyloxy group having an acid-labile group. More preferably, $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

According to a present invention, the second photosensitive polymer is also expressed by the following chemical formula:

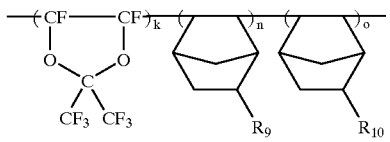

In the above formula, each of $R_9$ and $R_{10}$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon). At least one of $R_9$ and $R_{10}$ is fluorinated alklyoxy group having an acid-labile group. The ratio of k/(k+n+o) ranges from about 0.1 to about 0.7; the ratio of n/(k+n+o) ranges from about 0.1 to about 0.6; and the ratio of o/(k+n+o) ranges from about 0.1 to about 0.6.

Preferably, at least one of $R_9$ and $R_{10}$ is fluorinated alkyloxy group having an acid-labile group. More preferably, at least one of $R_9$ and $R_{10}$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The present invention also relates to third photosensitive polymer comprising:

(a) perfluoro-2,2-dimethy-1,3-dioxol derivatives having the following repeating unit:

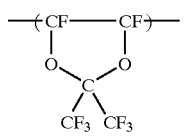

(b) vinyl derivatives having the following repeating unit:

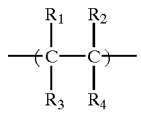

and (c) norbornen derivatives having the following repeating unit:

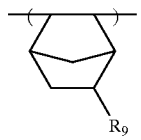

In the above formula, $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms in, the sum of carbon atom and oxygen atom in the Q is 2 to 10, and Z is COOR, $SO_2F$, CN, COF, or $OCH_3$, wherein R is alkyl group having 1 to 4 carbon).

Preferably, at least one of $R_4$ and $R_9$ is fluorinated alkyloxy group having an acid-labile group. More preferably, at least one of $R_4$ and $R_9$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The photosensitive polymers may have various molecular weights. Preferably, the photosensitive polymers have weight average molecular weights ranging from about 3,000 to about 200,000. More preferably, the weight average molecular weights range from about 4,000 to about 50,000.

According to a present invention, the third photosensitive polymer is expressed by the following chemical formula:

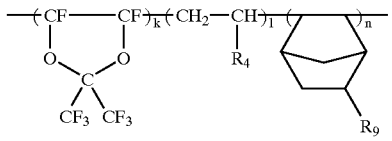

The ratio of k/(k+l+n) ranges about from about 0.1 to about 0.7; the ratio of l/(k+l+n) ranges about from about 0.1 to about 0.6; and the ratio of n/(k+l+n) ranges about from about 0.1 to about 0.6.

The present invention also relates to photoresist compositions. The photoresist compositions comprise:

(a) photosensitive polymers comprising:
(a-1) perfluoro-2,2-dimethy-1,3-dioxol derivatives having the following repeating unit:

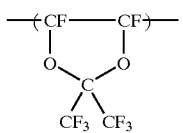

and (a-2) at least one comonomer selected from consisting of vinyl derivatives having the following repeating unit:

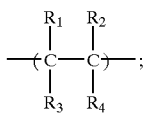

and norbornen derivatives having the following repeating unit:

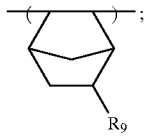

and (b) photoacid generator (PAG).

In the above formula, $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, at least one of $R_4$ and $R_9$ is fluorinated alkyloxy group having an acid-labile group. More preferably, at least one of $R_4$ and $R_9$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

According to a present invention, if the comonomer is vinyl derivative, the photoresist composition is expressed by the following chemical formula:

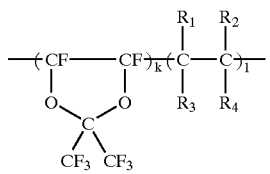

In the above formula, $R_1$ is H, Cl, or F; each of $R_2$ and $R_3$ is H or F; $R_4$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, $R_4$ is fluorinated alkyloxy group having an acid-labile group. More preferably, $R_4$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The ratio of k/(k+l) ranges from about 0.2 to about 0.7.

According to a present invention, if the comonomer is vinyl derivative, the photoresist composition is expressed by the following chemical formula:

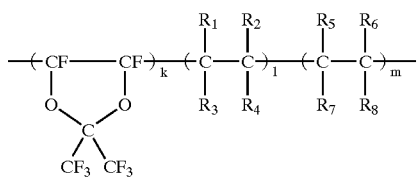

In the above formula, each of $R_1$ and $R_5$ is H, Cl, or F; each of $R_2$, $R_3$, $R_6$, and $R_7$ is H or F; each of $R_4$ and $R_8$ is H, F, $CF_3$, $OCF_3$, $OCF_2CF_3$, $OCF_2CF_2CF_3$, $CH_2C(CF_3)_2$ OH, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, at least one of $R_4$ and $R_8$ is fluorinated alkyloxy group having an acid-labile group. More preferably, at least one of $R_4$ and $R_8$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The ratio of k/(k+l+m) ranges from about 0.1 to about 0.7; the ratio of l/(k+l+m) ranges from about 0.1 to about 0.6; and the ratio of m/(k+l+m) ranges from about 0.1 to about 0.6.

According to a present invention, if the comonomer is nobornene derivative, the photoresist composition is expressed by the following chemical formula:

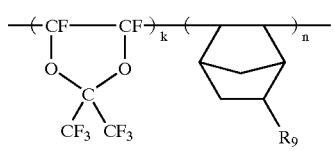

In the above formula, $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, $R_9$ is fluorinated alkyloxy group having an acid-labile group. More preferably, $R_9$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The ratio of $k/(k+n)$ ranges from about 0.2 to about 0.7.

According to a present invention, if the comonomer is nobornene derivative, the photoresist composition is also expressed by the following chemical formula:

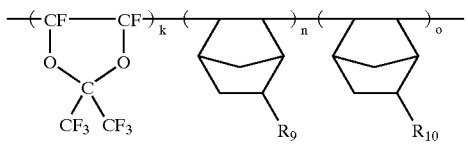

In the above formula, each of $R_9$ and $R_{10}$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$ (wherein $R_F$ is n-perfluoroalkyl group having 1 to 3 carbon atoms), or OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, at least one of $R_9$ and $R_{10}$ is fluorinated alkyloxy group having an acid-labile group. More preferably, at least one of $R_9$ and $R_{10}$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The ratio of $k/(k+n+o)$ ranges from about 0.1 to about 0.7; the ratio of $n/(k+n+o)$ ranges from about 0.1 to about 0.6; and the ratio of $o/(k+n+o)$ ranges from about 0.1 to about 0.6.

According to a present invention, if the comonomers are both vinyl derivative and nobornene derivative, the photoresist composition is also expressed by the following chemical formula:

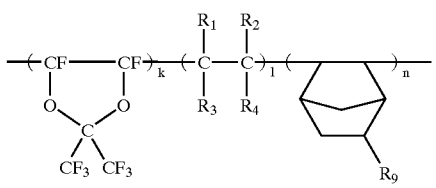

In the above formula, $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms; $OR_F$ (wherein $R_F$ is n-perfluoroalkyl group having 1 to 3 carbon atoms); OQZ (wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon).

Preferably, at least one of $R_4$ and $R_9$ is fluorinated alklyoxy group having an acid-labile group. More preferably, at least one of $R_4$ and $R_9$ is $CH_2C(CF_3)_2$ $OCH_2OCH_3$, $CH_2C(CF_3)_2OCH_2OCH_2CH_3$, $CH_2C(CF_3)_2$ $OCH(CH_3)OCH_3$, or $CH_2C(CF_3)_2OCH(CH_3)OCH_2CH_3$.

The ratio of $k/(k+l+n)$ ranges from about 0.1 to about 0.7; the ratio of $l/(k+l+n)$ ranges from about 0.1 to about 0.6; and the ratio of $n/(k+l+n)$ ranges from about 0.1 to about 0.6.

The photosensitive polymers may have various molecular weights. Preferably, the photosensitive polymers have weight average molecular weights ranging from about 3,000 to about 200,000. More preferably, the weight average molecular weights range from about 4,000 to about 50,000.

Various photoacid generators may be used in the photoresist compositions. Preferably, the photoacid generators are selected from the group consisting of triarysulfonium salts, diaryl iodonium salts, sulfonates, and the mixtures thereof. More preferably, the photoacid generators are selected from group consisting of triphenyl sulfonium triflate, triphenyl sulfonium antimonate, diphenyl iodonium triflate, diphenyl iodonium antimonate, methoxy diphenyl iodonium triflate, di-t-butyl diphenyl iodonium triflate, 2,6-dinitrobenzyl sulfonates, pyrogallol tris(alkylsulfonates)), N-hydroxysuccin imide triflate, norbornene-dicarboximide-triflate, triphenyl sulfonium nonaflate, diphenyl iodonium nonaflate, methoxy diphenyl iodonium nonaflate, di-t-butyl diphenyl iodonium nonaflate, N-hydroxysuccin imide nonaflate, norbornene-dicarboximide-nonaflate, triphenyl sulfonium perfluorooctane sulfonate (PFOS), diphenyl iodonium PFOS, methoxy diphenyl iodonium PFOS, di-t-butyl diphenyl iodonium triflate, N-hydroxy succinimide PFOS, norbornene-dicarboximide PFOS, and the mixtures thereof.

Preferably, the photoresist compositions include from about 0.5 to about 20 weight percent of the photoacid generators based on the weight of the photosensitive polymers.

The photoresist compositions further comprise an organic bases in an amount of from about 10 to about 50 mole percent based on the mole of the photoacid generators. Preferably, the organic bases are selected from the tertiary amine group and mixtures thereof. More preferably, the organic bases are selected from group consisting of triethyl amine, triisobutyl amine, triisooctyl amine, triisodecyl amine, triethanol amine, N,N-dimethyl-1-naphthyl amine, N-cyclohexyl pyrrolidinone, N-cyclopentyl pyrrolidinone, N-pentyl pyrrolidinone, N-hexyl pyrrolidinone, N-allyl caprolactam, N-ethyl caprolactam, N-butyl caprolactam, N-propyl caprolactam, N-butyl valerolactam, N-isobutyl valerolactam, N-secbutyl valerolactam, and mixtures thereof.

The photoresist compositions according to a preferred embodiment of the present invention are transparent at 157 nm wavelength. Moreover, the etch resistance of the photoresist compositions is superior to conventional photoresist compositions. Also, lifting of photoresist films formed from photoresist compostions typically does not occur primary due to its excellent adhesiveness. Thus, the photoresist compositions using the photosensitive polymers according to the present invention produce a sharp photoresist pattern when exposed at a laser of 157 nm wavelength.

The following examples are set forth for illustrating the present invention, and are not to be interpreted as limiting thereof.

EXAMPLE 1

Synthesis of Copolymer

The synthesized copolymer can be represented by the following formula:

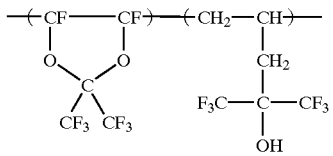

51 g (0.21 mol) of perfluoro-2,2-dimethy-1,3-dioxol, 330 g of 1,1,2-trichloro-1,2,2-trifluoroethane and 0.2 g of 4,4'-bis(t-butylcyclohexyl) peroxydicarbonate were dissolved in a 330 ml of chilled steel shaking tube. The steel shaking tube was sealed and was cooled to about −50° C. to about −80° C. using dry-ice contained acetone bath and purged with nitrogen ($N_2$) gas. Then, 43.7 g (0.21 mol) of following monomer having chemical formula 3 was added thereto.

[Chemical Formula 3]

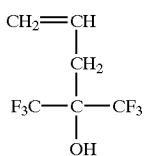

The steel shaking tube was shaken for about 1 hour at about 50° C. to about 70° C., and then, was cooled to room temperature. The reaction product was dried by vacuum distillation. Subsequently, the reaction product was dried in a vacuum oven at about 130° C. to obtain a synthesized copolymer. (yield: 57%)

The synthesized copolymer had a weight-average molecular weight (Mw) of 5,300 and a polydispersity (weight-average molecular weight/number-average molecular weight (Mn)) of 2.1.

EXAMPLE 2

Synthesis of Copolymer

The synthesized copolymer can be represented by the following formula:

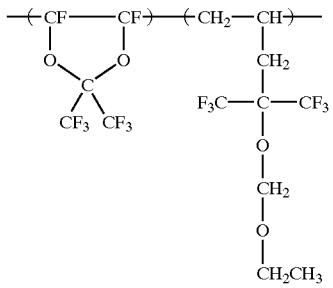

73 g (0.3 mol) of perfluoro-2,2-dimethy-1,3-dioxol, 80 g of 1,1,2-trichloro-1,2,2-trifluoroethane and 79.9 g (0.3 mol) of following monomer having chemical formula 4 were mixed in a chilled shaking tube, and 5 g of 4,4'-bis(t-butylcylcohexyl) peroxydicarbonate was added thereto.

[Chemical formula 4]

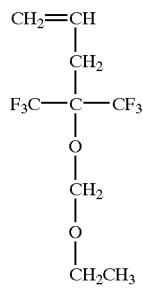

The steel shaking tube was sealed and purged with nitrogen ($N_2$) gas. Subsequently, the steel shaking tube was shaken for about 12 hour at about 40° C. The reaction product was dried by vacuum distillation and was dried in a vacuum oven at about 130° C. to obtain a copolymer. (yield: 53%)

The obtained copolymer had a weight-average molecular weight (Mw) of 7,000 and a polydispersity (Mw/Mn) of 2.2.

EXAMPLE 3

Synthesis of Copolymer

The synthesized copolymer can be represented by the following formula:

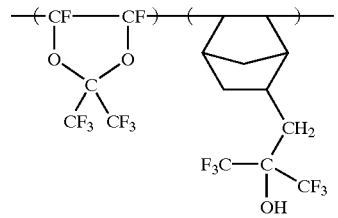

73 g (0.3 mol) of perfluoro-2,2-dimethy-1,3-dioxol, 80 g of 1,1,2-trichloro-1,2,2-trifluoroethane and 82.3 g (0.3 mol) of following monomer having chemical formula 5 were mixed in a chilling shaking tube, and 5 g of 4,4'-bis(t-butylcylcohexyl) peroxydicarbonate was added thereto.

[Chemical formula 5]

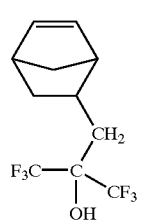

The steel shaking tube was sealed and purged with nitrogen ($N_2$) gas. Subsequently, the steel shaking tube was shaken for about 12 hour at about 40° C. The reaction product was dried by vacuum distillation and was dried in a vacuum oven at about 130° C. to obtain a copolymer. (yield: 51%)

The obtained copolymer had a weight-average molecular weight (Mw) of 4,700 and a polydispersity (Mw/Mn) of 2.3.

EXAMPLE 4

Synthesis of Copolymer

The synthesized copolymer can be represented by the following formula:

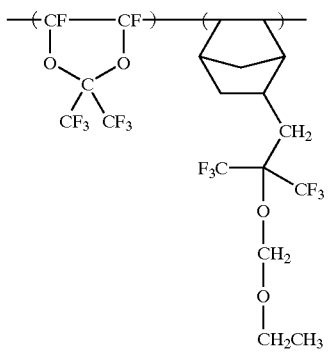

73 g (0.3 mol) of perfluoro-2,2-dimethy-1,3-dioxol, 80 g of 1,1,2-trichloro-1,2,2-trifluoroethane and 82.3 g (0.3 mol) of following monomer having chemical formula 6 were mixed in a chilled shaking tube, and 5 g of 4,4'-bis(t-butylcylcohexyl) peroxydicarbonate was added thereto.

[Chemical formula 6]

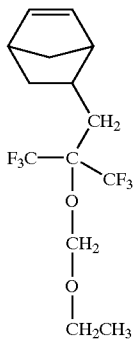

The steel shaking tube was sealed and purged with nitrogen ($N_2$) gas. Subsequently, the steel shaking tube was shaken for about 12 hour at about 40° C. The reaction product was dried by vacuum distillation and was dried in a vacuum oven at about 130° C. to obtain a copolymer. (yield: 49%)

The obtained copolymer had a weight-average molecular weight (Mw) of 5,900 and a polydispersity (Mw/Mn) of 2.1.

EXAMPLE 5

Synthesis of Terpolymer

The synthesized terpolymer can be represented by the following formula:

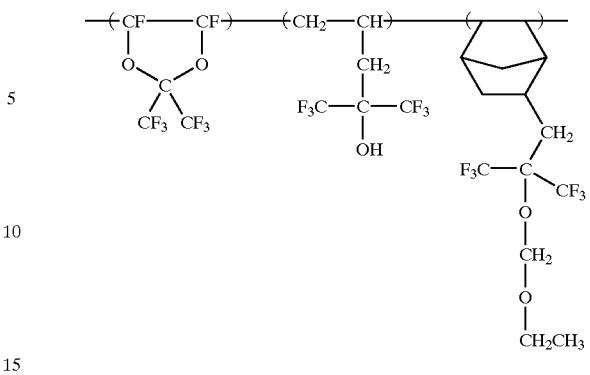

51 g (0.21 mol) of perfluoro-2,2-dimethy-1,3-dioxol, 330 g of 1,1,2-trichloro-1,2,2-trifluoroethane and 0.2 g of 4,4'-bis(t-butylcyclohexyl) peroxydicarbonate were dissolved in a 330 ml of chilled steel shaking tube. The steel shaking tube was sealed and was cooled to about −50° C. to about −80° C. using dry-ice contained acetone bath and and purged with nitrogen ($N_2$) gas. Then, 43.7 g (0.21 mol) of monomer having chemical formula 3 and 69.8 g (0.21 mol) of norbornen derivative monomer having chemical formula 6 were added thereto.

The steel shaking tube was shaken for about 1 hour at about 50° C. to about 70° C., and then, was cooled to room temperature. The reaction product was dried by vacuum distillation. Subsequently, the reaction product was dried in a vacuum oven at about 130° C. to obtain a synthesized copolymer. (yield: 65%)

The synthesized terpolymer had a weight-average molecular weight (Mw) of 9,000 and a polydispersity (Mw/Mn) of 2.4.

EXAMPLE 6

Synthesis of Terpolymer

The synthesized terpolymer can be represented by the following formula:

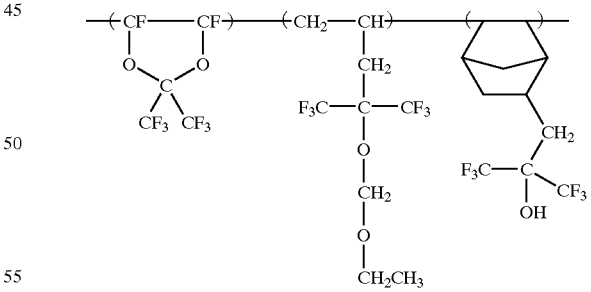

The terpolymer was obtained in the same way as in Example 5 using 55.9 g (0.21 mol) of a monomer having chemical formula 4 instead of a monomer having chemical formula 3 and 57.6 g (0.21 mol) of monomer having chemical formula 5 instead of a monomer having chemical formula 6. (yield: 60%)

The synthesized terpolymer had a weight-average molecular weight (Mw) of 5,700 and a polydispersity (Mw/Mn) of 2.6.

EXAMPLE 7

Synthesis of Terpolymer

The synthesized terpolymer can be represented by the following formula:

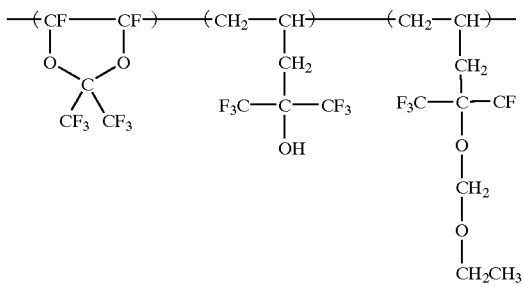

The terpolymer was obtained in the same way as in Example 5 using 55.9 g (0.21 mol) of a monomer having chemical formula 4 instead of a monomer having chemical formula 6. (yield: 68%)

The synthesized terpolymer had a weight-average molecular weight (Mw) of 6,500 and a polydispersity (Mw/Mn) of 2.1.

EXAMPLE 8

Synthesis of Terpolymer

The synthesized terpolymer can be represented by the following formula:

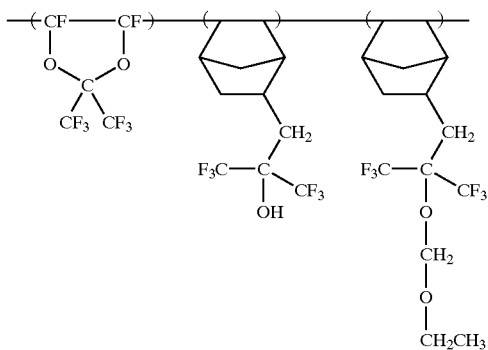

The terpolymer was obtained in the same way as in Example 5 using 57.6 g (0.21 mol) of monomer having chemical formula 5 instead of a monomer having chemical formula 3. (yield: 49%)

The synthesized terpolymer had a weight-average molecular weight (Mw) of 9,700 and a polydispersity (Mw/Mn) of 2.5.

EXAMPLE 9

Preparation of Photoresist Composition 1 g of the copolymer synthesized in Example 4, and 0.005 g of triphenyl sulfonium trifluoromethane sulfonate (triflate) and 0.01 g of triphenyl sulfonium nonafluorobutane sulfonate (nonaflate) as a photoacid generator (PAG) and 30 mole percent of triisodecyl amine based on the mole of PAG as an organic base were dissolved in 10 g of perfluoro(2-butyl tetrahydrofuran). The solution was stirred and filtered using membrane filters of 0.2 μm to form a photoresist composition. The photoresist composition was coated of a silicon wafer treated with hexamethyl disilazane (HMDS) to a thickness of about 0.2 μm.

The silicon wafers coated with the photoresist composition was pre-baked at about 120° C. to about 140° C. for about 60 seconds to 90 seconds and was exposed using a specific $F_2$ laser stepper (NA=0.5 and o=7). Then, the silicon wafer was subjected to a post-exposure baking (PEB) at about 120° C. to about 140° C. for about 60 seconds to 90 seconds. And then, the silicon wafer were developed to form a photoresist pattern by dipping in a mixed solution of 30% by weight isopropyl alcohol and about 2.38 weight % of tetramethyl ammonium hydroxide (TMAH) solution. As a result, a photoresist pattern having a profile with 120–200 nm line and space arrays could be formed with an exposure energy of about 8 mJ/cm$^2$ to about 20 mJ/cm$^2$ dose.

EXAMPLE 10

Preparation of Photoresist Composition

Photresisit composition was obtained in the same way as in Example 9 using 30 mole percent of N-allyl caprolactam based on the mole of PAG instead of triisodecylamine as an organic base.

As a result, a photoresist pattern having a profile with 120–200 nm line and space arrays could be formed with an exposure energy of about 8 mJ/cm$^2$ to about 20 mJ/cm$^2$ dose.

EXAMPLE 11

Preparation of Photoresist Composition

Photresisit composition was obtained in the same way as in Example 9 using 30 mole percent of N-cyclopentyl pyrrolidinone based on the mole of PAG instead of triisodecylamine as an organic base.

As a result, a photoresist pattern having a profile with 120–200 nm line and space arrays could be formed with an exposure energy of about 8 mJ/cm$^2$ to about 20 mJ/cm$^2$ dose.

EXAMPLE 12

Preparation of Photoresist Composition

Photresisit composition was obtained in the same way as in Example 10 using 1 g of the terpolymer synthesized in Example 5 instead of the copolymer synthesized in Example 4.

As a result, a photoresist pattern having a profile with 120–200 nm line and space arrays could be formed with an exposure energy of about 8 mJ/cm$^2$ to about 20 mJ/cm$^2$ dose.

EXAMPLE 13

Preparation of Photoresist Composition

Photresisit composition was obtained in the same way as in Example 10 using 1 g of the terpolymer synthesized in Example 6 instead of the copolymer synthesized in Example 4.

As a result, a photoresist pattern having a profile with 120–200 nm line and space arrays could be formed with an exposure energy of about 8 mJ/cm$^2$ to about 20 mJ/cm$^2$ dose.

EXAMPLE 14

Preparation of Photoresist Composition

Photresisit composition was obtained in the same way as in Example 10 using 1 g of the terpolymer synthesized in Example 7 instead of the copolymer synthesized in Example 4.

As a result, a photoresist pattern having a profile with 120–200 nm line and space arrays could be formed with an exposure energy of about 8 mJ/cm² to about 20 mJ/cm² dose.

EXAMPLE 15

Preparation of Photoresist Composition

Photresisit composition was obtained in the same way as in Example 10 using 1 g of the terpolymer synthesized in Example 8 instead of the copolymer synthesized in Example 4.

As a result, a photoresist pattern having a profile with 120–200 nm line and space arrays could be formed with an exposure energy of about 8 mJ/cm² to about 20 mJ/cm² dose.

The photosensitive polymer according to the present invention has a fluorine as a backbone or a side chain of the polymer, the fluorine is transparent when exposed a laser of 157 nm wavelength, so that the photosensitive plolymer of the present invention has an excellent transparency at a laser of 157 nm wavelength.

The photosensitive polymer of the present invention has a cyclic structure as a backbone, so its resistance to dry etching is strong.

And the photosensitive polymer of the present invention has an ether group, so its adhesiveness to a underlying layer is good. In particular, using a hexafluoroisopropanol group which can bound to the side chain of the polymer, its adhesiveness to the underlying layer can be controlled.

Accordingly, the photoresist having the photosensitive polymer of the present invenion is transparent at a laser of 157 nm wavelength, is excellent in its resistance against an etching process, and displays good adhesiveness to reduce lifting phenomenon.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A photosensitive polymer comprising:
  (a) perfluoro-2,2-dimethy-1,2-dioxol derivative having the following repeating unit:

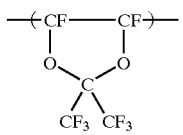

and (b) vinyl derivative having the following repeating unit:

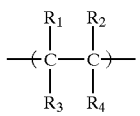

wherein $R_1$ is H, Cl, or F; each of $R_2$ and $R_3$ is H or F; $R_4$ is $OCF_2CF_2CF_3$, $CH_2C(CF_3)_2OH$, or fluorinated alkyloxy group having an acid-labile group.

2. The photosensitive polymer of claim 1, wherein $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

3. The photosensitive polymer of claim 1, wherein the photosensitive polymer has a weight average molecular weight ranging from about 3,000 to about 200,000.

4. The photosensitive polymer of claim 3, wherein the photosensitive polymer has a weight average molecular weight ranging from about 4,000 to about 50,000.

5. The photosensitive polymer of claim 1, wherein the photosensitive polymer is expressed by the following chemical formula:

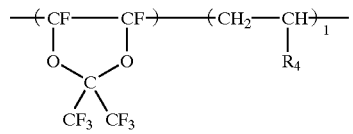

wherein the ratio of k/(k+l) ranges from about 0.2 to about 0.7.

6. The photosensitive polymer of claim 5, wherein $R_4$ comprises fluorinated alkyloxy group having an acid-labile group.

7. The photosensitive polymer of claim 5, wherein $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

8. The photosensitive polymer of claim 1, wherein the photosensitive polymer is expressed by the following chemical formula:

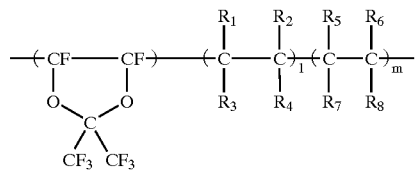

wherein each of $R_1$ and $R_5$ is H, Cl, or F; each of $R_2$, $R_3$, $R_6$ and $R_7$ is H or F; each of $R_4$ and $R_8$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon; at least one of $R_4$ and $R_8$ comprises fluorinated alklyoxy group having an acid-labile group; the ratio of k/(k+l+m) ranges from about 0.1 to about 0.7; the ratio of l/(k+l+m) ranges from about 0.1 to about 0.6; and the ratio of m/(k+l+m) ranges from about 0.1 to about 0.6.

9. The photosensitive polymer of claim 8, wherein at least one of $R_4$ and $R_8$ comprises $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

10. A photosensitive polymer comprising:

(a) perfluoro-2,2-dimethy-1,3-dioxol derivative having the following repeating unit:

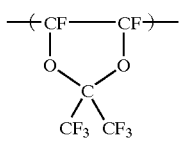

and (b) norbornen derivative having the following repeating unit:

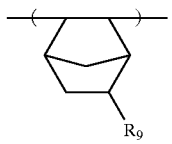

wherein $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon.

11. The photosensitive polymer of claim 10, wherein $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

12. The photosensitive polymer of claim 10, wherein the photosensitive polymer has a weight average molecular weight ranging from about 3,000 to about 200,000.

13. The photosensitive polymer of claim 12, wherein the photosensitive polymer has a weight average molecular weight ranging from about 4,000 to about 50,000.

14. The photosensitive polymer of claim 10, wherein the photosensitive polymer is expressed by the following chemical formula:

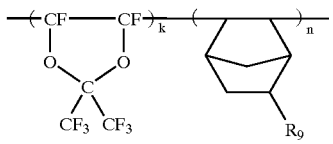

where the ratio of k/(k+n) ranges from about 0.2 to about 0.7.

15. The photosensitive polymer of claim 14, wherein $R_9$ comprises fluorinated alkyloxy group having an acid-labile group.

16. The photosensitive polymer of claim 14, wherein $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

17. The photosensitive polymer of claim 10, wherein the photosensitive polymer is expressed by the following chemical formula:

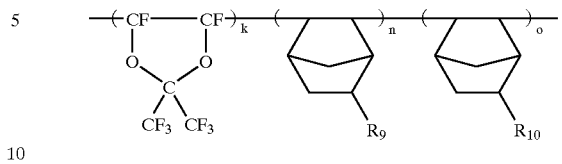

wherein $R_{10}$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon; at least one of $R_9$ and $R_{10}$ comprises fluorinated alklyoxy group having an acidlabile group; the ratio of k/(k+n+o) ranges from about 0.1 to about 0.7; the ratio of n/(k+n+o) ranges from about 0.1 to about 0.6; and the ratio of o/(k+n+o) ranges from about 0.1 to about 0.6.

18. The photosensitive polymer of claim 17, wherein at least one of $R_9$ and $R_{10}$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

19. A photosensitive polymer comprising:

(a) perfluoro-2,2-dimethy-1,3-dioxol derivative having the following repeating unit:

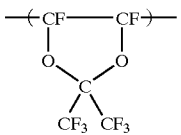

(b) vinyl derivative having the following repeating unit:

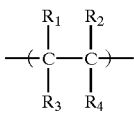

and (c) norbornen derivative having the following repeating unit:

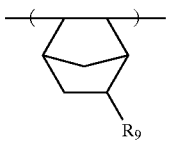

wherein $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon.

20. The photosensitive polymer of claim 19, wherein at least one of $R_4$ and $R_9$ is $CH_2C(CF_3)_2OCH_2OCH_3$, $CH_2C$ $(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

21. The photosensitive polymer of claim 19, wherein the photosensitive polymer has a weight average molecular weight ranging from about 3,000 to about 200,000.

22. The photosensitive polymer of claim 21, wherein the photosensitive polymer has a weight average molecular weight ranging from about 4,000 to about 50,000.

23. The photosensitive polymer of claim 19, wherein the photosensitive polymer is expressed by the following chemical formula:

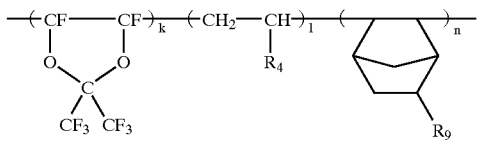

wherein at least one of $R_4$ and $R_9$ comprises fluorinated alkyloxy group having an acid-labile group; the ratio of l/(k+l+n) ranges from about 0.1 to about 0.7; the ratio of n/(k+l+n) ranges from about 0.1 to about 0.6; and the ratio of n/(k+l+n) ranges from about 0.1 to about 0.6.

24. The photosensitive polymer of claim 23, wherein at least one of $R_4$ and $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

25. A photoresist composition comprising:
(a) a photosensitive polymer comprsing:
(a-1) perfluoro-2,2-dimethy-1,3-dioxol derivatives having the following repeating unit:

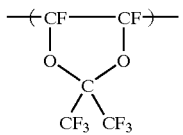

and (a-2) at least one comonomer of a vinyl derivative having the following repeating unit:

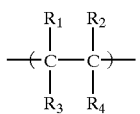

and a norbornen derivative having the following repeating unit:

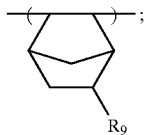

and (b) a photoacid generator (PAG),
wherein $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon.

26. The photoresist composition of claim 25, wherein the photosensitive polymer has a weight average molecular weight ranging from about 3,000 to about 200,000.

27. The photoresist composition of claim 26, wherein the photosensitive polymer has a weight average molecular weight ranging from about 4,000 to about 50,000.

28. The photoresist composition of claim 25, wherein the photoresist composition is expressed by the following chemical formula:

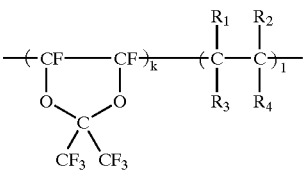

wherein the ratio of k/(k+l) ranges from about 0.2 to about 0.7.

29. The photosensitive polymer of claim 28, wherein $R_4$ comprises fluorinated alkyloxy group having an acid-labile group.

30. The photoresist composition of claim 25, wherein $R_4$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

31. The photoresist composition of claim 25, wherein the photoresist composition is expressed by the following chemical formula:

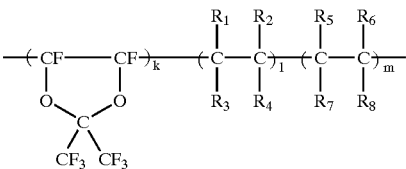

wherein each of $R_1$ and $R_5$ is H, Cl, or F; each of $R_2$, $R_3$, $R_6$, and $R_7$ is H or F; each of $R_4$ and $R_8$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms; the sum of carbon atom and oxygen atom in the Q is 2 to 10; and Z is COOR, $SO_2F$, CN, COF, or $OCH_3$, wherein R is alkyl group having 1 to 4 carbon; at least one of $R_4$ and $R_8$ comprises fluorinated alkyoxy group having an acid-labile group; the ratio of k/(k+l+m) ranges from about 0.1 to about 0.7; the ratio of l/(k+l+m) ranges from about 0.1 to about 0.6; and the ratio of m/(k+l+m) ranges from about 0.1 to about 0.6.

32. The photoresist composition of claim 31, wherein at least one of $R_4$ and $R_8$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

33. The photoresist composition of claim 25, wherein the photoresist composition is expressed by the following chemical formula:

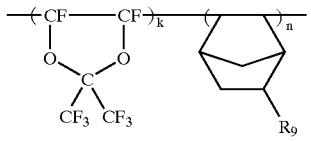

wherein the ratio of k/(k+n) ranges from about 0.2 to about 0.7.

34. The photosensitive polymer of claim 33, wherein $R_9$ comprises fluorinated alkyloxy group having an acid-labile group.

35. The photoresist composition of claim 33, wherein $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

36. The photoresist composition of claim 25, wherein the photoresist composition is expressed by the following chemical formula:

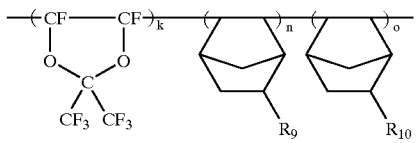

wherein each of $R_9$ and $R_{10}$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, COF, CN, or $OCH_3$, wherein R is alkyl group having 1 to 4 carbon; at least one of $R_9$ and $R_{10}$ comprises fluorinated alklyoxy group having an acid-labile group; the ratio of k/(k+n+o) ranges from about 0.1 to about 0.7; the ratio of n/(k+n+o) ranges from about 0.1 to about 0.6; and the ratio of o/(k+n+o) ranges from about 0.1 to about 0.6.

37. The photoresist composition of claim 36, wherein at least one of $R_9$ and $R_{10}$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

38. The photoresist composition of claim 25, wherein the photoresist composition is expressed by the following chemical formula:

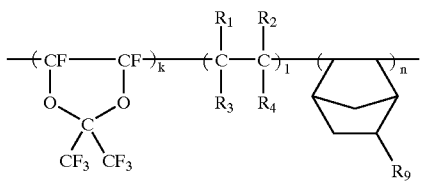

wherein $R_1$ is H, Cl, or F; each of $R_2$ and $R_3$ is H or F; each of $R_4$ and $R_9$ is H, F, $CF_3$, $OCF_3$, $OCF_2CF_3$, $OCF_2CF_2CF_3$, $CH_2C(CF_3)_2OH$, fluorinated alkyloxy group having an acid-labile group, n-perfluoroalkyl group having 1 to 8 carbon atoms, $OR_F$, wherein $R_F$ is n-perfluoroalkyl group having 1 to 3 carbon atoms, or OQZ, wherein Q is perfluorinated alkylene group having 0 to 5 oxygen atoms, the sum of carbon atom and oxygen atom in the Q is 2 to 10, and Z is COOR, $SO_2F$, CN, COF, or $OCH_3$, wherein R is alkyl group having 1 to 4 carbon; at least one of $R_4$ and $R_9$ comprises fluorinated alklyoxy group having an acidlabile group; the ratio of k/(k+l+n) ranges from about 0.1 to about 0.7; the ratio of l/(k+l+n); ranges from about 0.1 to about 0.6; and the ratio of n/(k+l+n) ranges from about 0.1 to about 0.6.

39. The photoresist composition of claim 38, wherein at least one of $R_4$ and $R_9$ is $CH_2C(CF_3)_2OCH_2OCH_3$, $CH_2C(CF_3)_2OCH_2OCH_2CH_3$, $CH_2C(CF_3)_2OCH(CH_3)OCH_3$, or $CH_2C(CF_3)_2OCH(CH_3)OCH_2CH_3$.

40. The photoresist composition of claim 25, wherein the photoresist composition comprises from about 0.5 to about 20 weight percent of the photoacid generator based on the weight of the photosensitive polymer.

41. The photoresist composition of claim 25, wherein the photoacid generator is selected from the group consisting of triarylsulfonium salt, diaryliodonium salt, sulfonate, and the mixtures thereof.

42. The photoresist composition of claim 25, wherein the photoacid generator is selected from group consisting of triphenyl sulfonium triflate, triphenyl sulfonium antimonate, diphenyl iodonium triflate, diphenyl iodonium antimonate, methoxy diphenyl iodonium triflate, di-t-butyl diphenyl iodonium triflate, 2,6-dinitrobenzyl sulfonates, pyrogallol tris(alkylsulfonates)), N-hydroxysuccin imide triflate, norbornene-dicarboximide-triflate, triphenyl sulfonium nonaflate, diphenyl iodonium nonaflate, methoxy diphenyl iodonium nonaflate, di-t-butyl diphenyl iodonium nonaflate, N-hydroxysuccin imide nonaflate, norbornene-dicarboximide-nonaflate, triphenyl sulfonium perfluorooctane sulfonate (PFOS), diphenyl iodonium PFOS, methoxy diphenyl iodonium PFOS, di-t-butyl diphenyl iodonium triflate, N-hydroxy succinimide PFOS, norbornene-dicarboximide PFOS, and the mixtures thereof.

43. The photoresist composition of claim 25, further comprising an organic base.

44. The photoresist composition of claim 25, further comprising an organic base ranging from about 10 to about 50 mole percent based on the mole of the photoacid generator.

45. The photoresist composition of claim 43, wherein the organic base is selected from the tertiary amine group, and mixtures thereof.

46. The photoresist composition of claim 43, wherein the organic base is selected from group consisting of triethyl amine, triisobutyl amine, triisooctyl amine, triisodecyl amine, triethanol amine, N,N-dimethyl-1-naphthyl amine, N-cyclohexyl pyrrolidinone, N-cyclopentyl pyrrolidinone, N-pentyl pyrrolidinone, N-hexyl pyrrolidinone, N-allyl caprolactam, N-ethyl caprolactam, N-butyl caprolactam, N-propyl caprolactam, N-butyl valerolactam, N-isobutyl valerolactam, N-secbutyl valerolactam, and mixtures thereof.

* * * * *